United States Patent
Buhler et al.

(10) Patent No.: US 7,057,330 B2
(45) Date of Patent: Jun. 6, 2006

(54) BROAD FREQUENCY BAND ENERGY SCAVENGER

(75) Inventors: Steven A. Buhler, Sunnyvale, CA (US); John S. Fitch, Los Altos, CA (US); Eric J. Shrader, Belmont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 87 days.

(21) Appl. No.: 10/739,847

(22) Filed: Dec. 18, 2003

(65) Prior Publication Data

US 2005/0134148 A1    Jun. 23, 2005

(51) Int. Cl.
*H02N 2/18*    (2006.01)

(52) U.S. Cl. .................. 310/339; 310/328

(58) Field of Classification Search ............. 310/328, 310/339

See application file for complete search history.

(56) References Cited

U.S. PATENT DOCUMENTS

| | | | | |
|---|---|---|---|---|
| 2,880,333 A | * | 3/1959 | Dranetz | 310/326 |
| 3,739,202 A | * | 6/1973 | Cady | 310/329 |
| 3,900,748 A | | 8/1975 | Adler | 310/333 |
| 3,986,669 A | * | 10/1976 | Martner | 239/102.2 |
| 4,051,395 A | * | 9/1977 | Taylor | 310/329 |
| 4,467,236 A | | 8/1984 | Kolm et al. | 310/321 |
| 4,504,761 A | | 3/1985 | Triplett | 310/339 |
| 4,677,336 A | | 6/1987 | Kushida et al. | 310/334 |
| 4,803,392 A | | 2/1989 | Kushida et al. | 310/311 |
| 4,841,191 A | | 6/1989 | Takada et al. | 250/442.11 |
| 5,245,245 A | | 9/1993 | Goldenberg | 310/330 |
| 5,436,622 A | | 7/1995 | Gutman et al. | 340/7.6 |
| 5,552,657 A | | 9/1996 | Epstein et al. | 310/339 |
| 5,751,091 A | | 5/1998 | Takahashi et al. | 310/339 |
| 5,801,475 A | | 9/1998 | Kimura | 310/319 |
| 5,814,921 A | | 9/1998 | Carroll | 310/339 |
| 5,835,996 A | | 11/1998 | Hashimoto et al. | 323/364 |
| 5,856,722 A | | 1/1999 | Haronian et al. | 310/321 |
| 6,078,126 A | | 6/2000 | Rollins et al. | 310/330 |
| 6,205,315 B1 | | 3/2001 | Montfort et al. | 399/319 |
| 6,407,484 B1 | | 6/2002 | Oliver et al. | 310/339 |
| 6,411,016 B1 | | 6/2002 | Umeda et al. | 310/339 |
| 6,448,690 B1 | | 9/2002 | Sawai et al. | 310/320 |

(Continued)

FOREIGN PATENT DOCUMENTS

GB    2326275 A    12/1998

OTHER PUBLICATIONS

Geffrey K. Ottman et al., "Adaptive Piezoelectric Energy Harvesting Circuit for Wireless Remote Power Supply", *IEEE Transactions on Power Electronics*, vol. 17, No. 5, pp. 669-676, Sep. 2002.

(Continued)

*Primary Examiner*—Darren Schuberg
*Assistant Examiner*—J. Aguirrechea
(74) *Attorney, Agent, or Firm*—Fay, Sharpe, Fagan, Minnich & McKee, LLP

(57) ABSTRACT

In accordance with one aspect of the present exemplary embodiment, an energy generation device is provided. A base is fixedly secured to a source of mechanical energy of an oscillatory nature. At least one mass is movably suspended relative to the base. First and second members movably suspend the at least one mass relative to the base. The first and second flexible members convert mechanical energy from oscillations emitted by the source of mechanical energy into electrical signals.

22 Claims, 11 Drawing Sheets

U.S. PATENT DOCUMENTS

| | | | |
|---|---|---|---|
| 6,559,550 B1 | 5/2003 | Herman | 290/1 R |
| 6,580,177 B1 | 6/2003 | Hagood, IV et al. | 290/1 R |
| 6,619,126 B1* | 9/2003 | Orten | 73/649 |
| 6,750,596 B1* | 6/2004 | Kim et al. | 310/339 |
| 6,771,007 B1* | 8/2004 | Tanielian | 310/339 |
| 6,806,624 B1* | 10/2004 | Lee et al. | 310/339 |
| 6,861,785 B1* | 3/2005 | Andre et al. | 310/339 |
| 6,936,932 B1* | 8/2005 | Kenney | 290/1 R |
| 2002/0043895 A1* | 4/2002 | Richards et al. | 310/328 |
| 2002/0070635 A1 | 6/2002 | Morrison et al. | 310/311 |
| 2002/0074898 A1 | 6/2002 | Maue et al. | 310/311 |
| 2003/0020364 A1 | 1/2003 | Nakatani | 310/311 |
| 2003/0020365 A1 | 1/2003 | Yamada et al. | 310/311 |
| 2004/0135554 A1* | 7/2004 | Clingman | 320/166 |
| 2005/0073221 A1* | 4/2005 | Albsmeier et al. | 310/339 |
| 2005/0134148 A1* | 6/2005 | Buhler et al. | 310/339 |

OTHER PUBLICATIONS

Robert C. Byrd National Technology Transfer Center, "69 Phase I Selections from the 97.2 Solicitation" (7 pages). See p. 3—Active Devices, Inc.

Ferro Solutions, Energy Harvesters & Sensors, *"Energy Harvesters"*, © 2004 Ferro Solutions, Inc., http://www.ferrosi.com/products.htm (4 pages).

C.B. Williams et al., "Feasibility Study of Vibration-Electric Generator for Bridge Vibration Sensors", *IMAC-XVI Proceedings*, pp. 1111-1117, 1997.

Dr. Donald J. Leo, *Mechanical Engineering*, Virginia Tech, http://www.me.vt.edu/people/faculty/leo.html (7 pages).

"Circuit transfers four times more power out of shakes and rattle", Public Release Date: Sep. 23, 2002, http://www.eurekalert.org/pub_releases/2002-09/ps-ctf092302.php (1 page).

Cyberpunks.Org, "Better peizo-electric power generation", © 1998-2002 Darkemane Industries, http://www.cyberpunks.org/dispay/841/article (3 pages).

Shad Roundy et al., "A study of low level vibrations as a power source for wireless sensor nodes", pp. 1131-1144, Computer Communications, © 2002 Elsevier Science B.V.

Jan M. Rabaey et al., PicoRadio Supports Ad Hoc Ultra-Low Power Wireless Networking, *Cover Feature Wireless Computing*, pp. 42-48, © 2000 IEEE.

Nasa & University of Florida ES CSTC (Environmental Systems Commercial Space Technology Center), http://www.enveng.ufl.edu/escstc/ (3 pages).

Shad Roundy, "Energy Scavenging and Vibration-to-Electricity Conversion", Nov. 2002 (3 pages).

USITT—University of Southampton Institute of Transducer Technology, "Self Powered Microsystems (SPMS)", © 2002 USITT & Department of Electronics and Computer Science (2 pages).

Rajeevan Amirtharajah et al., "A Micropower Programmable DSP Using Approximate Signal Processing Based on Distributed Arithmetic", *IEEE Journal of Solid-State Circuits*, vol. 39, No. 2, pp. 337-347, Feb. 2004.

Sunghwan Kim, "Low Power Energy Harvesting with Piezoelectric Generators", University of Pittsburgh 2002, Electronic Theses & Disserations, http://etd.library,pitt.edu/ETD/available/etd-12092002-153537/ (151 pages).

Sunghwan Kim et al., "Piezoelectric energy harvesting using a clamped circular plate: experimental verification", submitted to the *ASME International Mechanical Engineering Congress and Exposition*, Washington, D.C., Nov. 2003 (17 pages).

Sunghwan Kim et al., "Piezoelectric energy harvesting using a diaphragm structure", presented at *SPIE's $10^{10}$ Annual Symposium on Smart Structures and Materials*, Mar. 2-6, 2003, San Diego, CA (11 pages).

* cited by examiner

BROAD FREQUENCY BAND ENERGY SCAVENGER

BACKGROUND

The present exemplary embodiment relates to the ambient energy scavenging arts. It finds particular application in conjunction with harnessing or harvesting vibrational energy in noisy environments, and will be described with particular reference thereto. However, it is to be appreciated the exemplary embodiment is also amenable to other applications.

Advances which have been made in solar, thermal, fluid and other energy collection devices have been documented. However, although energy collection devices for these sources are available, a need also exists for energy scavengers that reliably collect useful amounts of vibrational energy. Vibrational energy scavengers convert vibration energy from the environment into electrical energy without the need for a bulk storage battery, fuel cell, or other long-term means of on-board energy. Energy scavengers produce electrical energy as long as they are in an environment with vibrations, such as buildings, transportation systems, industrial equipment, or other vibration generating environment. In one embodiment, relative motion of an internal mass is used to generate forces that bend flexible support beams. The bending activates a piezoelectric, such as segmented piezoelectric elements and/or other energy conversion material on or about the beams, generating electricity from ambient vibrations.

Existing vibrational energy scavengers are rather limited in use, and have a narrow range of application, as each energy harnesser must be specifically tailored to a specific task. Existing energy scavengers tend to operate best at a single resonant frequency. On the other hand, vibration spectra in real world environments have a broad, ever-changing distribution of frequencies. Therefore, an energy scavenging system that is able to harness energy over a frequency range would produce more energy and be more reliable and more versatile than existing systems, since an energy scavenger that is only responsive to a single resonant frequency misses out on most of the vibrational energy that is produced within any given environment.

U.S. Pat. No. 5,245,245 to Goldenberg describes a vibrator, which does not operate as a generator. When a vibration is applied to this structure the piezo structure vibrates. The beam frequency may be altered by a sliding mechanism. This essentially shortens the beam to change its resonant frequency. The preferred application of this patent is for pagers or other things requiring sound. The patent discusses mechanical stops to protect the beam. They are not discussed as energy enhancers. This is not a broad band frequency collector, Goldenberg only collects vibrations from a single frequency at one time.

U.S. Pat. No. 5,835,996 to Hashimoto describes a power generator for electronic devices. Hashimoto emphasizes voltage ratios which yield optimal power. Some of the embodiments require a device to displace the piezo structure. Hashimoto does not describe a beam operating at various frequencies. One particular vibrational beam structure is defined and consists of a spiral piezo, with a mass at the internal end. This mass moves up and down, only in one direction. Translation in other directions is not described for energy harnessing. The purpose of the spring is to operate where acceleration varies and to provide 'stability' for the mass, so it won't move in the other directions. Hashimoto fails to discuss variable frequency.

U.S. Pat. No. 5,751,091 Piezoelectric to Takahashi describes a sandwich beam structure which is wider at the end opposite from the mass near the attachment to the base. Takahashi describes beams made of chunks of piezo poled in the direction of the beam length Intended for wrist watches. This device has limited application, intended for excitation by human movement.

U.S. Pat. No. 6,407,484 to Oliver, et al. describes a piezoelectric energy harnesser and method. A self contained device for harnessing electrical energy from linear and rotary motion has a sensor with amplifiers for tensile stretching of a piezoelectric body with magnification of the applied force. The piezoelectric body is a monolithic plate with surface electrodes covering its top and bottom surfaces.

U.S. Pat. No. 5,801,475 to Kimura describes a self-powering device based on piezo-electric materials that accumulates power until it reaches a specified voltage, and discharges that voltage to the load device. Several beams are included in one device, such that each beam is displaced in x, y, or z directions. In other words, random directions of vibrations can be scavenged. Kimura includes no broad band frequency discussions.

Finally, U.S. Pat. No. 6,411,016 to Umeda discusses piezo structures that generate electricity when masses hammer into them. Pendulums, sliding bars, rolling balls, wind-chime driven masses are several of the embodiments described. Umeda describes a vibrator rather than a scavenger.

BRIEF DESCRIPTION

In accordance with one aspect of the present exemplary embodiment, an energy generation device is provided. A base is fixedly secured to a source of mechanical energy of an oscillatory nature. At least one mass is movably suspended relative to the base. First and second members movably suspend the at least one mass relative to the base. The first and second flexible members convert mechanical energy from oscillations emitted by the source of mechanical energy into electrical signals.

In accordance with another aspect of the present exemplary embodiment, a method of energy conversion is provided. Input mechanical energy is received along at least one range of motion, causing a mass to oscillate in the at least one mode of oscillation. A portion of kinetic energy of the oscillations of the mass in the at least one mode of oscillation is converted into oscillations of the mass in a second, different mode of oscillation, causing the mass to simultaneously oscillate in two separate modes of oscillation. Mechanical energy from the motions of the mass in the at least two modes of oscillation is converted into electrical energy.

BRIEF DESCRIPTION OF THE DRAWINGS

The exemplary embodiment may take form in various components and arrangements of components, and in various steps and arrangements of steps. The drawings are only for purposes of illustrating preferred embodiments and are not to be construed as limiting the exemplary embodiment.

DETAILED DESCRIPTION

Figure 1:
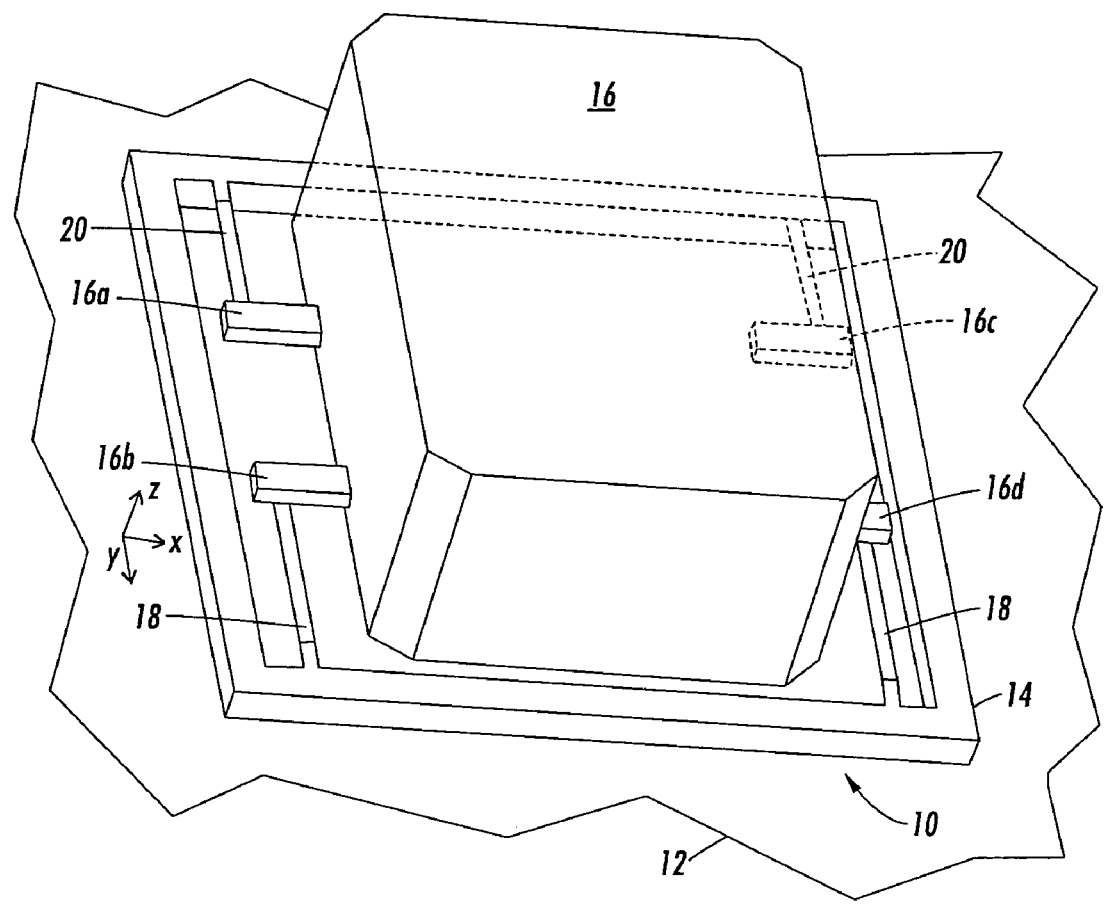
FIG. 1 is a perspective view of a first suitable embodiment of a broad frequency band energy harnessing device.
Figure 2:
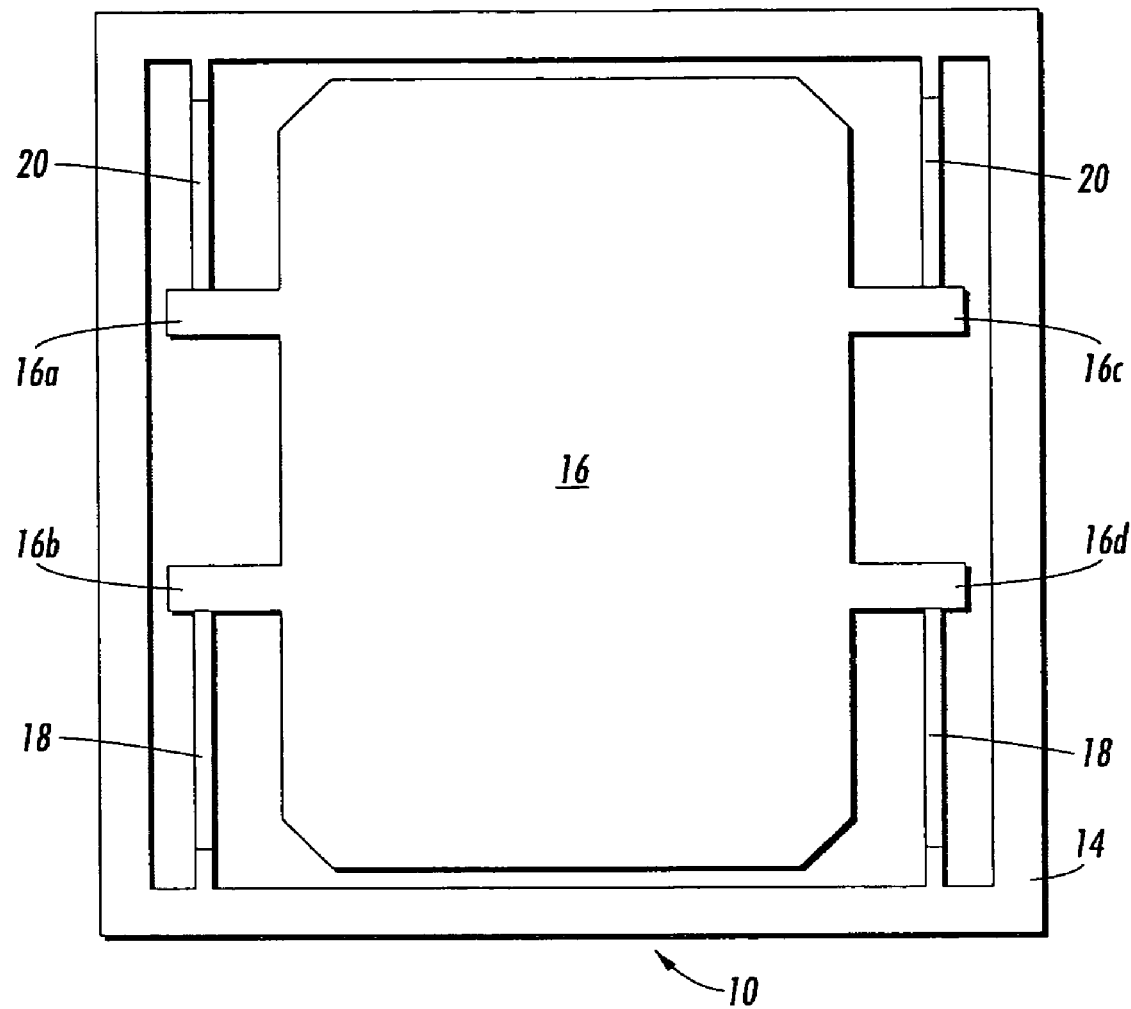
FIG. 2 is a view along the z-axis of the device of FIG. 1.

With reference to FIGS. 1 and 2, an energy harnessing (also called harvesting) assembly 10 according to the present application is shown fixedly attached to an energy source 12. The energy source 12 by its nature emits kinetic energy in the form of mechanical vibrations. The source 12 is much larger in mass than the energy harnessing assembly 10, and is not appreciably affected by the presence of the assembly 10. In one suitable embodiment, the source is an automobile engine block, or other interior surface of an automobile, and the assembly 10 weighs on the order of grams, although it is understood the assembly is not intended to be limited to a specific weight. Other possible embodiments include mounting on a machine in a factory environment, and any other surfaces where noise and vibrations are natural by-products of operation.

With further attention to the specific case of an automobile, the frequency of the vibrations depend on several factors, including speed of the automobile, RPMs of the engine, engine type, build, as well as other factors. Many of these factors are constants over the life of the automobile, and others (such as speed and RPM) fall into bounded ranges. From these factors, a typical operating range of emitted frequencies can be obtained. For example, in one investigation, an automobile was considered to have a vibration signature with multiple amplitude peaks at about 120 Hz, 240 Hz, 360 Hz, and 480 Hz. Having such information, the specific design of the assembly 10 may then be tailored to harness energy from the range of frequencies. Of course, it is to be understood that other frequencies of mechanical vibrations are possible, and even expected, but a high percentage of frequencies will fall into the predetermined range of frequencies. In the automobile embodiment, most of the input vibrations occurred within a range of 10–500 Hz.

The energy harnessing assembly 10 includes a base 14 that is fixedly secured to the source 12. Vibrations (i.e., source vibrations) of the source 12 cause like vibrations in the base (or support structure) 14. A mass 16, with tabs 16a–16d, is suspended by flexible members (such as springs) 18, 20, causing the mass to be mobile relative to the base 14 and the source 12. Vibrations of the source 12 cause subsequent oscillations of the mass 16 relative to the base 14, resulting in the flexible members 18, 20 bending and flexing away from their equilibrium positions.

Each of the flexible members 18, 20 has a different spring constant (i.e., force per motion) and a different location relative to the center of mass 16. For the most efficient energy transfer, the frequency of the input vibrations of the source are the same as one or more of the resonant modes of the members 18, 20, and mass 16. Vibrations at frequencies other than the resonant frequencies will cause oscillations of the mass 16, but to a lesser degree.

Given that the frequency of the vibrations from the source, are of a known range, but unknown at any given instant, the preferred suspension of the mass 16 allows the assembly 10 to harness energy of a broad band of frequencies without knowing any instant value of the frequency.

In one design, the mass 16 is asymmetrically disposed within the base 14 (i.e. the center of the mass is offset from the base). The effect of such a placement of the mass is to convert one mode of motion into additional modes of motion.

For example, if source vibrations are received by the assembly 10 along a z-axis, the mass would oscillate along the z-axis. Additionally, because of its asymmetrical disposition, other modes of motion would be activated, such as rotation in the x and/or y-axis. Thus the energy of the vibrations are spread out over additional modes, which means that there are additional modes of energy collection possible for a single input vibration. The induced modes of motion are predictable because the asymmetrical disposition of the mass 16 is known, so it is possible to plan that those induced modes have different resonant frequencies than that of the original mode of vibration (e.g. translation in the z-axis). So instead of one resonant frequency, there can be two or three from a single input vibration. Since a single mass supported in space will have six degrees of freedom (3 translational, 3 rotational), as many as six modes of motion are possible, these being both rotation and translation in the x, y, and z axis.

Figure 3:
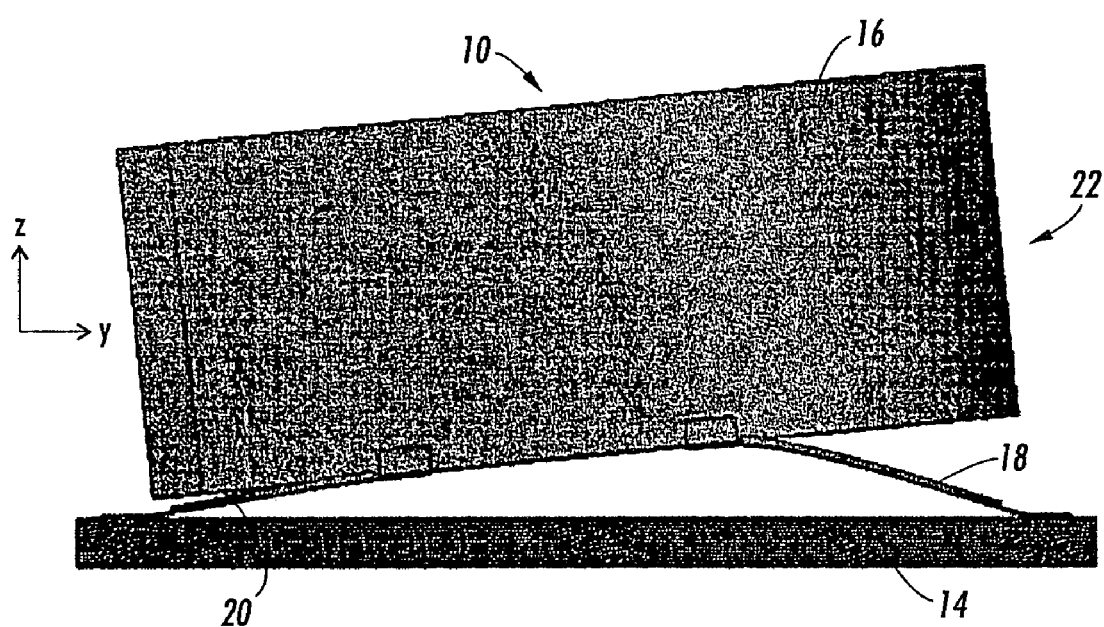
FIG. 3 is a view along the x-axis of the device of FIG. 1 depicting displacement of the device in the z-direction and rotation of the device in the x-axis.
Figure 4:
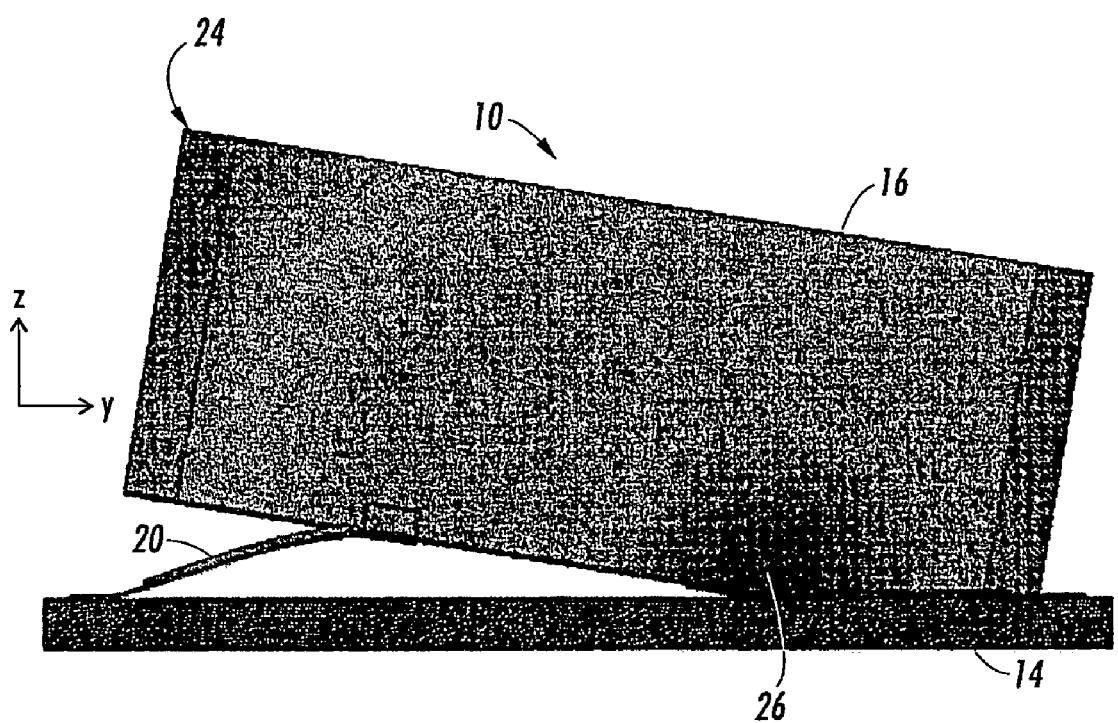
FIG. 4 is a view along the x-axis of the device of FIG. 1 depicting displacement of the device in the z-direction and rotation of the device in the x-axis, for a different resonant mode than shown in FIG. 3.
Figure 5:
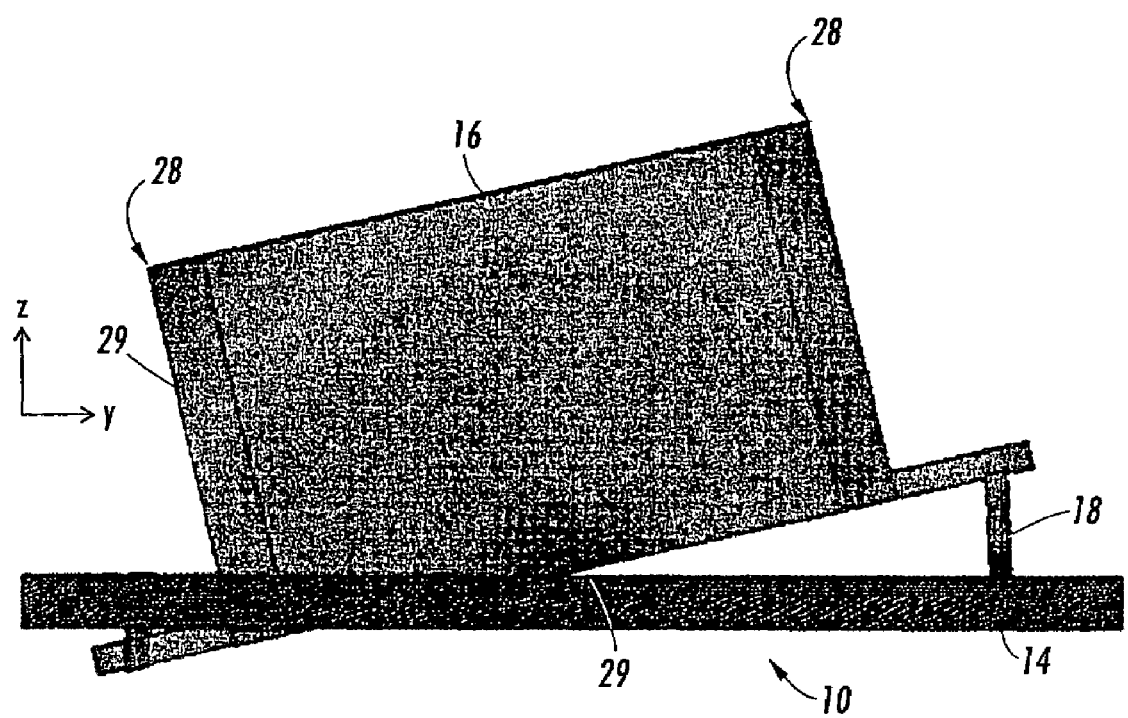
FIG. 5 is a view along the y-axis of the device of FIG. 1 depicting rotation of the device around the y-axis

FIG. 3 depicts at least translation in the z-axis, with rotation around the x-axis. The darker shaded portion 22 of the mass 16 represent the portion that has undergone the greatest displacement. Similarly, FIG. 4 shows translation in the z-axis and rotation about the x-axis. Shaded portion 24 is depicted as undergoing the most motion, while shaded portion 26 is shown as undergoing relatively little motion. FIG. 5 depicts the mass 16 undergoing at least rotation about the y-axis. Shaded portions 28 are shown as undergoing the most motion while shaded portion 29 undergoes the least motion.

Each resonant mode is excitable within a frequency band, that is, a range of frequencies that are close to the resonant frequency. Vibrations incumbent at the resonant frequency, of course, will have the greatest effect and energy transfer, but all frequencies within the band will cause the mode to oscillate, to some varying degree. The resonant frequency bands of each of the usable modes of vibration are chosen to be sufficiently close together, allowing some overlap to occur between the bands. Thus, if the frequency of the input vibrations increases or decreases, they may excite one mode of vibration of the device 10 less, but excite an adjacent mode more. By overlapping the bands of each individual mode of motion, a broad spectrum of input frequencies is accommodated. In the application of harnessing vibrations caused by an automobile engine, the bulk of the usable frequencies produced are less than 500 Hz, although they can also be found at frequencies above 500 Hz. Consequently, it is desired to create a band of sensitivity from about 10–500 Hz by overlapping the individual frequency sensitivity bands of the separate modes.

"Asymmetrical disposition", as used in this specification, may include a variety of concepts, the end results of which are similar, namely dispersing kinetic energy over multiple modes of motion. In the embodiment of FIG. 1, the concept may include placing the center of mass of the mass 16 off-center within the base 14. Subsets of this concept include physically displacing the equilibrium position of the mass 16 or using a mass of inconsistent density.

Another form of asymmetrical disposition may include varying the length of the flexible members 18, 20. In one suitable embodiment, the members 18 are slightly longer than the members 20. In an embodiment where the members 18, 20 are different lengths, strictly translational input vibrations will cause rotation of the mass because forces on one side of the mass (near the members 18) will be different than forces on the other side (near the members 20). As illustrated in FIG. 1, given that members 18 each have the same spring constant, and members 20 also each have the same spring constant, but different than that of the members 18, impulses that cause only translation in the z-axis will cause rotation around the x-axis, as the mass rocks back and forth. Similarly, all of the members 18, 20 can have different spring constants resulting in rotation around the x and y axis from z-translational input only, or even rotation around all three axis. For example, breaking the left-right symmetry of the members 18, 20 as shown in FIG. 2 would couple translational motion from a single input direction to all three rotational modes of motion. It is to be understood that the reciprocal analog is also true. That is, input vibrations that rotate the mass about one of the axis will be dispersed into translational motion along at least one other axis.

In one suitable embodiment, the flexible members 18, 20 include piezoelectric material. The members 18, 20 can be unimorph or bimorph piezoelectric beams. Thus, when members 18, 20 bend and flex in response to oscillations of the mass 16 electrical signals are generated. Alternately, the flexible members 18, 20 can include electrodes with flexible dielectric material dispersed between the electrodes, also producing electrical signals resulting from the bending and flexing of the members 18, 20. Electrical signals generated by the flexible members 18, 20 may immediately be used, or are conducted to a charge storage device (not shown) and saved for later use in powering an electronic device, such as a transmitter, receiver, sensor, or the like.

One suitable process for constructing piezo electric material includes a low-cost screen printing method which deposits PZT ceramic onto any one of various substrates. The devices are printed onto sapphire and fired at a temperature of about 1000° to 1300° C. to yield a dense ceramic with excellent bulk properties. These features are then laser released and transferred to the final substrate. This approach allows complex beam shapes to extract the maximum energy from each vibration mode and also allows the vibration modes to be distributed in frequency by design. This enables devices that are tailored to a particular vibration spectrum and are relatively broadband. An exemplary method of piezoelectric printing is also described in U.S. patent application Ser. No. 10/376,544 to Xu, et al. and entitled, Methods to Make Piezoelectric Ceramic Thick Film Array and Single Element and Devices, hereby fully incorporated by reference.

In another suitable embodiment, the members 18, 20 are made of a durable, flexible material, such as stainless steel. Deposits of piezoelectric material are located between the members 18, 20 and the base 14 expanding and contracting as the members oscillate, generating the electrical signals.

Figure 6:
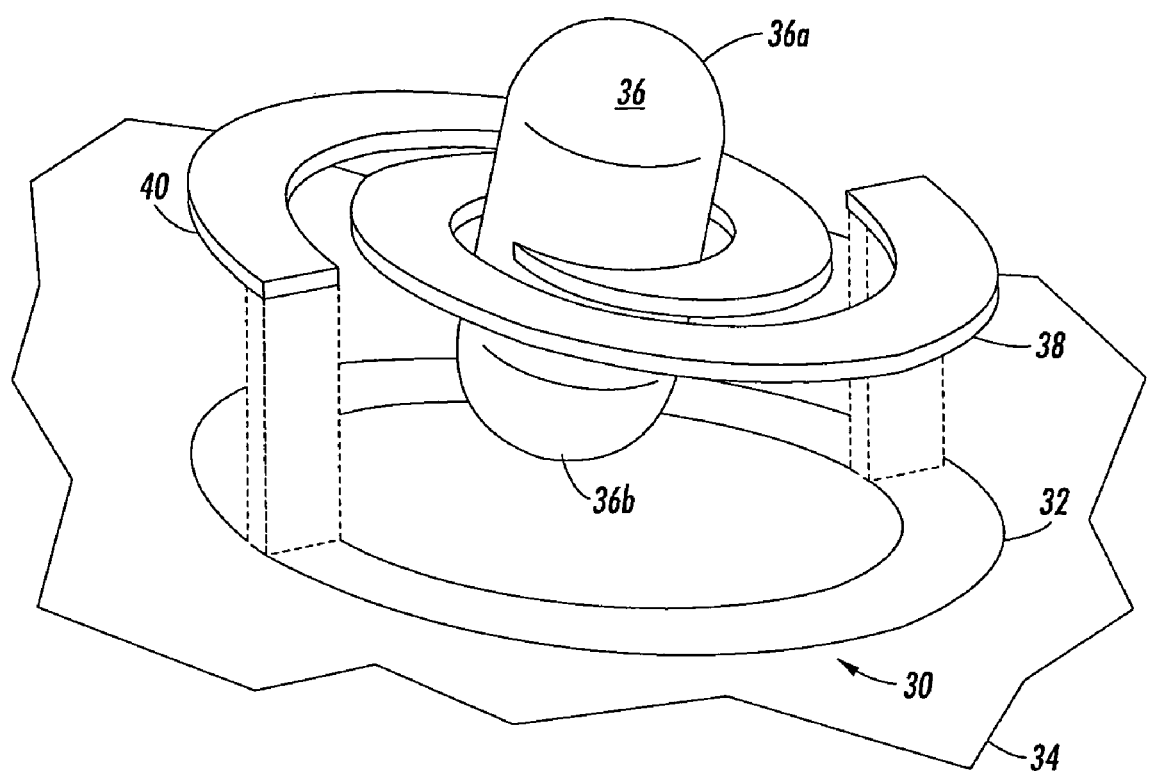
FIG. 6 is a perspective view of a second suitable embodiment of a broad frequency band energy harnessing device.
Figure 7:
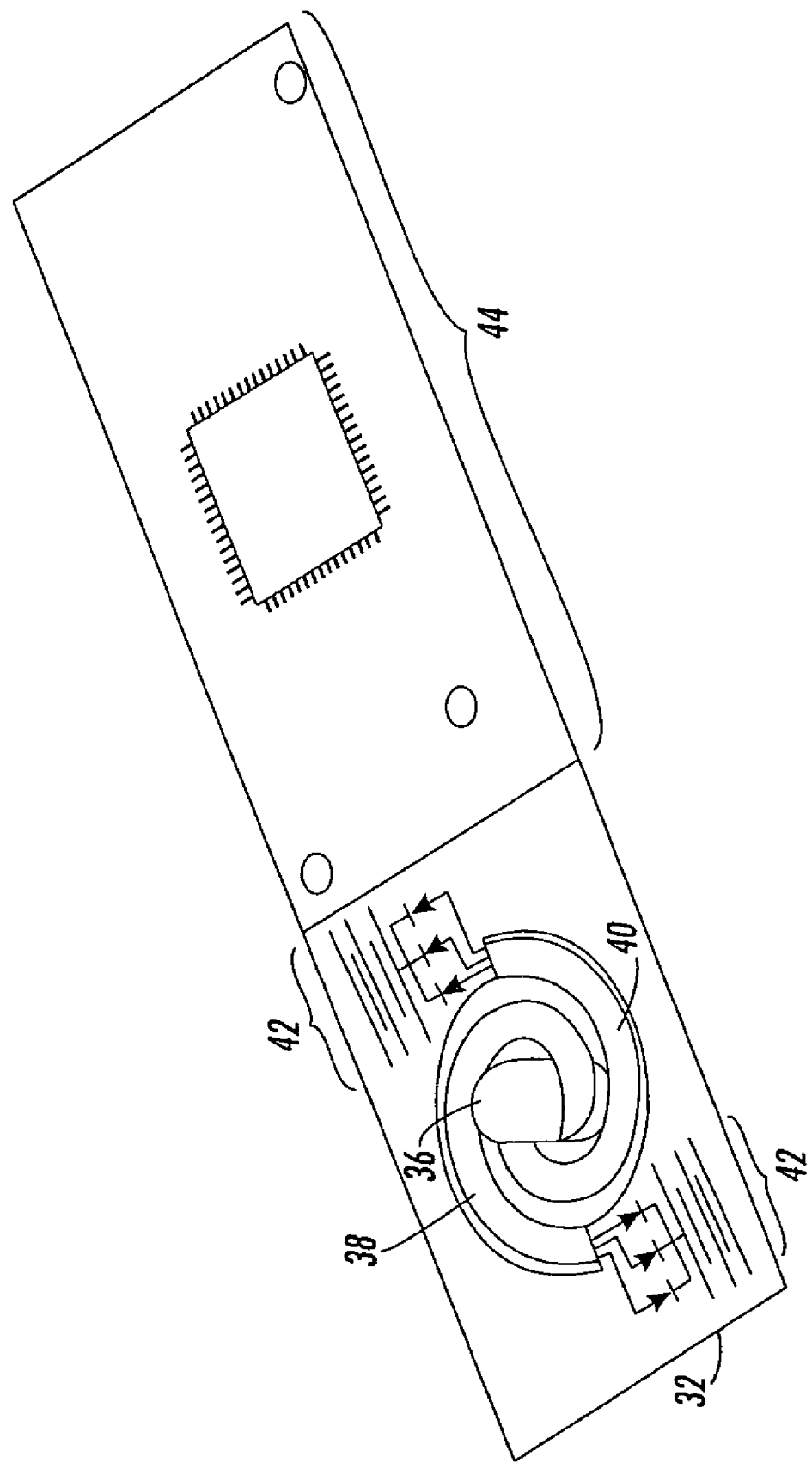
FIG. 7 is a concept sketch of the device of FIG. 6 implemented into a system with current rectification elements and an integrated circuit chipset.

FIG. 6 shows another embodiment of a single mass energy harnessing device 30. Like the embodiment of FIG. 1, the device 30 includes a base 32 that is fixedly attached to a source 34 of vibrational energy. For discussion purposes, FIG. 6 shows a device 30 out of plane from base 32. This is simply to distinguish the components. FIG. 7 is provided to show device 30 in plane with a base portion. A mass 36 is suspended by flexible members 38 and 40. Attachment between mass 36 and members 38 and 40 may be any known attachment mechanism, such as but not limited to welding, crimping, form fitting, etc.). The device 30 of FIG. 6 combines detection and energy harnessing capabilities for all six degree of freedom into two spiral flexible members. Again, the mass 36 is asymmetrically disposed to induce additional modes of motion, in a manner as discussed in association with the first embodiment. For example, the mass 36 may be positioned such that an upper portion 36a has a larger mass than a lower portion 36b and/or the mass may be tilted in a specific offset direction. Additionally, the mass may be one in accordance with the subsets mentioned in connection with the first embodiment. Alternately and/or in addition, the members 38, 40 could have different spring constants, dimensions and/or shapes.

Figure 8:
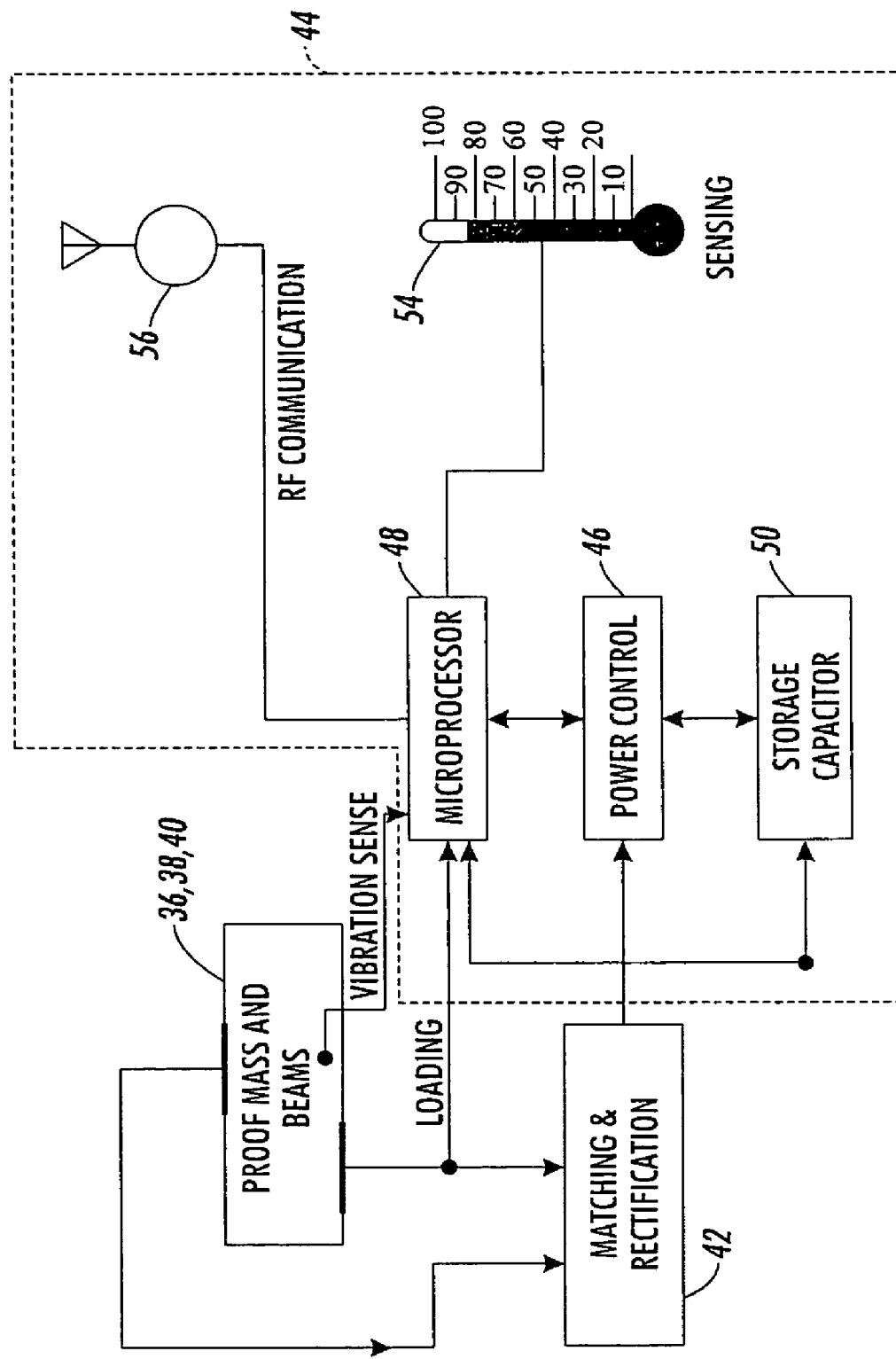
FIG. 8 is a diagrammatic illustration of the functions of the chipset of FIG. 7.

A concept sketch of the second single-mass embodiment integrated into a system is shown in FIG. 7. Attached to each flexible member 38, 40 is a set of matching and rectifying circuitry 42. The circuitry 42 conditions the electrical signals generated by the members 38,40 for use in powering an attached electronic device 44, an example of which is illustrated in FIG. 8. A power conditioning system is used to convert random environmental vibrations into well-regulated DC signals to operate sensing and/or transmitting devices. The power conditioning circuitry composed of 42, 46, 48 and 50 matches and rectifies the energy coming from the flexible members 38, 40, monitors incoming vibrations, and adjusts the system to operate at the best efficiency.

The device 44 preferably includes a power control portion 46 that accepts power from the matching and rectifying circuitry 42, and routes it either directly to a microprocessor 48 to power the device 44 or to a storage capacitor 50. The capacitor 50 can store charge for later in the event of an energy surplus, but more likely, it will store charge until enough energy is accumulated to allow the microprocessor 48 to perform a task. Such tasks may include, but are not limited to, taking a reading of an on-board thermometer 54 or sending a brief RF communications pulse with an on-board antenna 56. Other applications may include, but are in no way limited to, a closure detector for a trunk latch, doors, fuel doors, and seat belts or more complex analog systems such as detecting fuel or washer fluid levels, engine temperature, or external proximity sensors.

The computation for such application is similar to that of a key-fob remote keyless entry system processor. The system generates an address, possibly a security code, and a data payload. The data payload might be a single bit in the case of a switch closure, or a few bits corresponding to an analog value sensed. The RF communication antenna 56 is similar to a remote keyless entry system, although less power is needed because the distance is shorter (no greater than a car length) and known.

The communications pulse sent may advantageously include information gathered by another one of the microprocessor's 48 tasks. As alluded to in FIG. 8, the antenna 56 may send a signal that includes a temperature reading. In such an embodiment, a receiver (not shown) could be located in a fixed position relative to the antenna 56, minimizing the amount of power needed for the transmitted signal. That is, lower power directional antenna could be used, rather than relatively high power demanding antennae that emit radially symmetric signals. Also, as shown in FIG.

8, the microprocessor 48 performs vibration sensing tasks and mechanical load sensing tasks.

Figure 9:
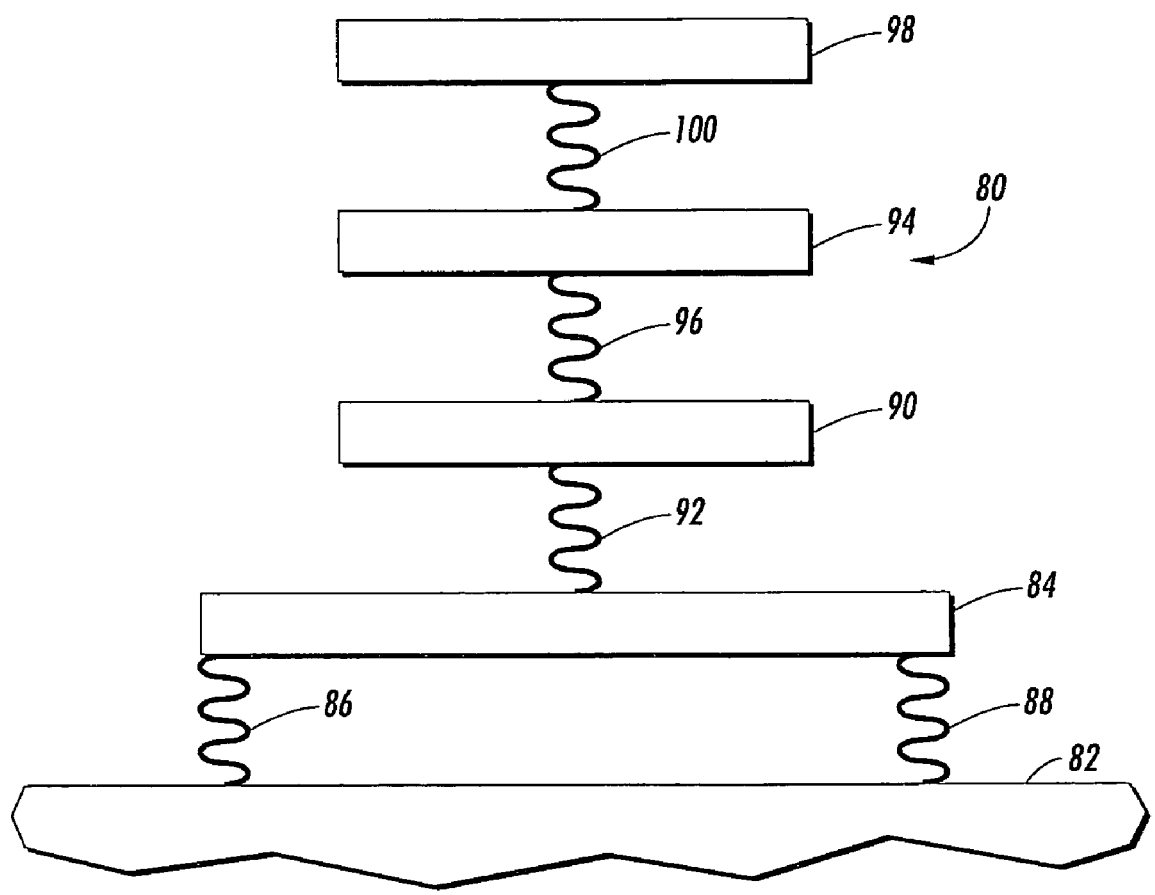
FIG. 9 is a third, multiple mass embodiment of a broad frequency band energy harnessing device.

FIG. 9 shows another embodiment of an energy harnessing device 80. This embodiment includes multiple masses connected to one another by springs. A base 82 is fixedly attached to a vibration source. A first mass 84 is connected by springs 86, 88 to the base 82. It is to be understood that the mass 84 can be connected to the base 82 by any number of springs, and two are shown in FIG. 9 for the sake of convenience. The mass 84 and springs 86, 88 combination is sensitive around a certain resonant frequency of vibrations, as dictated by the selected mass and spring constant.

Mass 90 is connected to mass 84 by a spring 92. Similar to the previous mass/spring combination, mass 90 and spring 92 are sensitive around a second resonant frequency. Similarly, mass 94 and spring 96 form a third combination sensitive around a third resonant frequency, and mass 98 and spring 100 form a fourth combination sensitive around a fourth resonant frequency. The resonant frequencies of the mass/spring combinations are selected to be sufficiently close together such that their spectrums of response overlap and form a range of vibrations which may be excited by a range of source vibration frequencies. It is to be understood that the number of resonant frequency sensitivities is not limited to four, rather it is limited by the practical restrictions (size, shape, electrical leads from the springs, etc.) of the system construction. The springs 86, 88, 92, 96, and 100 are preferably made with piezoelectric material. Movement of the springs create electrical power which is stored in an electrical storage device, such as a capacitor (not shown). These springs may be unimorph in design, piezoelectric mounted on another material such as stainless steel, or may be a bimorph design. It is not necessary that all the springs have power conversion capability. Those that do not convert power do not waste much power. In practice, power conversion from one set of springs, for example 86, 88, may be preferred due to connection constraints. Overall loss of power conversion efficiency may be minimal, since most resonant modes couple power into all or nearly all of the springs. As with the previous embodiments, the electrical energy is used to power an electrical device.

Figure 10:
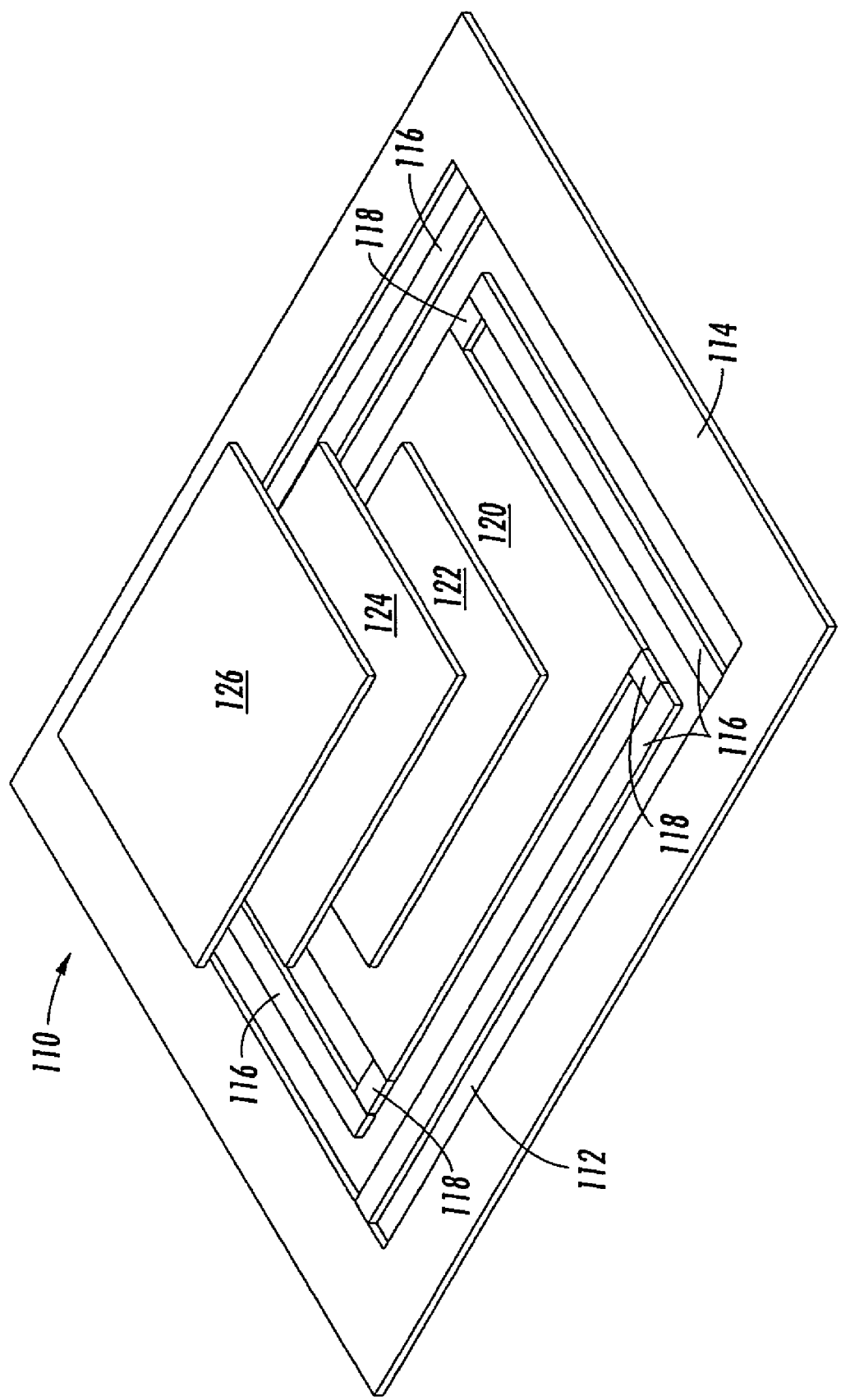
FIG. 10 is a perspective view of the device of FIG. 9.

FIG. 10 depicts a somewhat more detailed view of a multiple mass vibrational energy harnessing device 110, based on the concepts set forth in FIG. 1 and FIG. 9. Particularly, a number of the energy harnessers illustrated in FIG. 1 are stacked to provide multiple masses as disclosed in the device of FIG. 9. More particularly, a first energy scavenging device 112, based on the concepts of the device of FIG. 1, is attached to a base 114 via flexible members 116, where the other end of the flexible members 116 are connected to tabs 118 of the mass 120. The additional vibrational scavenging devices 122, 124 and 126 are shown simply in block form. However, it is to be understood they are also constructed in accordance with the previous teachings. In FIG. 10, the interconnection between the individual scavenging devices is not shown. However, it is to be appreciated they may be interconnected via spring mechanisms such as shown in FIG. 9, or other appropriate arrangement.

Figure 11:
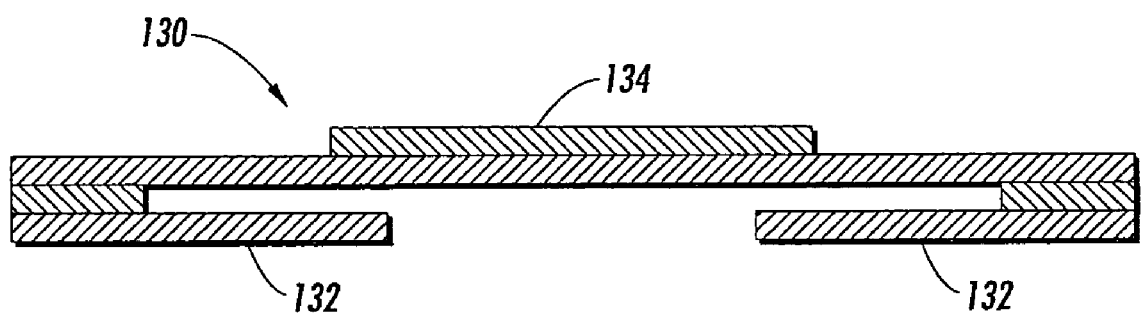
FIG. 11 is a cross-sectional view of a spring design which may be implemented in a multiple mass design.

Also, FIG. 11 is a cross-sectional view of a unit 130 which may be used in a multiple mass system. The unit 130 may be built up from 2D etched stainless steel parts. As shown, unit 130 employs leaf spring members 132 which are in operative connection with mass 134. It is understood this design would function in substantially the same manner as the previous embodiments, and a complete assembly would contain a stack of units 130.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. An energy generation device comprising:
   a base fixedly secured to a source of mechanical energy of an oscillatory nature;
   at least one mass movably suspended relative to the base;
   a first flexible member for movably suspending the at least one mass relative to the base;
   a second flexible member for movably suspending the at least one mass relative to the base; and
   the first and second flexible members, generating two modes of oscillation upon application of the mechanical energy from a single direction, and converting the mechanical energy from the oscillations emitted by the source of mechanical energy into electrical signals.

2. The energy generation device as set forth in claim 1, wherein the first flexible member, together with the at least one mass, has at least one resonant frequency, and
   the second flexible member, together with the at least one mass, has at least one resonant frequency different from that of the first flexible member, wherein the first flexible member has at least one of a spring constant, a dimension or a shape different from at least one of a spring constant, a dimension or a shape of the second flexible member.

3. The energy generation device as set forth in claim 2, wherein the flexible members include piezoelectric elements that convert mechanical energy into electrical energy.

4. The energy generation device as set forth in claim 2, wherein the flexible members are compressible dielectric material between electrodes that convert mechanical energy into electrical energy.

5. The energy generation device as set forth in claim 2, wherein the mass is asymmetrically supported by the flexible members, such asymmetrical disposition causing translation of the mass from vibrations of the source to in part be converted into rotation of the mass.

6. The energy generation device as set forth in claim 2, wherein the mass is asymmetrically supported by the flexible members, such asymmetrical disposition causing rotation of the mass from vibrations of the source to in part be converted into translation of the mass.

7. The energy generation device as set forth in claim 2, wherein input energy of the source moves the mass and flexes both the first and second flexible members.

8. The energy generation device as set forth in claim 1, wherein the at least two flexible members are sensitive to translation of the mass in a z-direction, and further including:
   a flexible member that is sensitive to translation of the mass in a y-direction;
   a flexible member that is sensitive to translation of the mass in an x-direction;
   a flexible member that is sensitive to rotation of the mass in a z-axis;
   a flexible member that is sensitive to rotation of the mass in a y-axis;
   a flexible member that is sensitive to rotation of the mass in an x-axis; and, wherein any of the flexible members may be combined into a single member.

9. The method of claim 1, wherein the first resonant frequency and the second resonant frequency are substantially proximal to each other such that respective bands of possible excitation frequencies of the modes of oscillation overlap.

10. The energy generation device according to claim 1, wherein the at least one mass includes a plurality of masses at least some connected to each other and others are connected to the base and other masses of the plurality.

11. The energy generation device according to claim 1, wherein the at least one mass is located asymmetrically by physically displacing the equilibrium position of the at least one mass or using a mass of inconsistent density.

12. A method of energy conversion comprising:
receiving input mechanical energy along range of motion, causing a mass to oscillate in a first mode of oscillation;
converting a portion of kinetic energy of the oscillations of the mass in the first mode of oscillation into oscillations of the mass in a second, different mode of oscillation, causing the mass to simultaneously oscillate in two separate modes of oscillation; and
converting mechanical energy from the motions of the mass in the two modes of oscillation into electrical energy, wherein the motions of the mass are obtained by use of a flexible member.

13. The method as set forth in claim 12, further including:
converting a portion of the kinetic energy received from the source range of motion into oscillations of the mass in a third mode of oscillation, causing the mass to simultaneously oscillate in three separate modes of oscillations.

14. The method as set forth in claim 13, wherein:
the at least one mode of oscillation has a first resonant frequency;
the second mode of oscillation has a second resonant frequency, different from the first mode of oscillation resonant frequency; and,
the third mode of oscillation has a third resonant frequency different from the first mode of oscillation resonant frequency and the second mode of oscillation resonant frequency.

15. The method as set forth in claim 14, wherein resonant frequencies of the at least first, second, and third modes of oscillation are substantially proximal to each other such that respective bands of possible excitation frequencies of each mode of oscillation overlap.

16. The method as set forth in claim 13, wherein the at least one mode of oscillation is translational and the second and third modes of oscillation are rotational.

17. The method as set forth in claim 13, wherein the at least one mode of oscillation is rotational and the second and third modes of oscillation are translational.

18. The method as set forth in claim 12, further including:
using piezoelectric material to convert the mechanical energy into electrical energy.

19. The method as set forth in claim 12, further including using compressible dielectric material between electrodes to convert mechanical energy into electrical energy.

20. The method as set forth in claim 12, wherein the input mechanical energy is incident on the base along any of six degrees of freedom, the ranges including:
x-translational;
y-translational;
z-translational;
x-rotational;
y-rotational;
z-rotational;
or a combination of any of the above six degrees of freedom.

21. A method of energy conversion comprising:
receiving kinetic energy along at least one degree of freedom at an incumbent frequency;
spreading the kinetic energy over multiple masses interconnected with flexible members, the masses and flexible members having multiple resonant frequencies, wherein at least some of the flexible members are providing interconnection between a base and some of the masses and others of the flexible members are providing interconnection between the masses; and
converting a portion of the kinetic energy into electrical energy.

22. A method of energy conversion comprising:
receiving mechanical energy in a single direction the mechanical energy having a bounded range of frequencies;
transforming the mechanical energy by distributing the mechanical energy over multiple masses interconnected with flexible members, the masses and flexible members having multiple resonant frequencies, wherein the directional input mechanical energy is distributed over multiple modes of oscillation, and wherein at least some of the flexible members are providing interconnection between a base and some of the masses and others of the flexible members provide interconnection between the masses; and
converting a part of the input energy into electrical energy in more than one of the multiple modes of oscillations.

* * * * *